United States Patent
Ko et al.

(10) Patent No.: US 11,347,143 B2
(45) Date of Patent: May 31, 2022

(54) CLEANING METHOD, METHOD FOR FORMING SEMICONDUCTOR STRUCTURE AND SYSTEM THEREOF

(71) Applicant: TAIWAN SEMICONDUCTOR MANUFACTURING COMPANY LTD., Hsinchu (TW)

(72) Inventors: Wu-Hung Ko, Tainan (TW); Chung-Hung Lin, Tainan (TW); Chih-Wei Wen, Tainan (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 7 days.

(21) Appl. No.: 16/943,881

(22) Filed: Jul. 30, 2020

(65) Prior Publication Data

US 2021/0096460 A1 Apr. 1, 2021

Related U.S. Application Data

(60) Provisional application No. 62/907,963, filed on Sep. 30, 2019.

(51) Int. Cl.
| | | |
|---|---|---|
| *G03F 1/82* | (2012.01) | |
| *B08B 7/00* | (2006.01) | |
| *H01L 21/67* | (2006.01) | |
| *G03F 7/20* | (2006.01) | |

(52) U.S. Cl.
CPC ............ *G03F 1/82* (2013.01); *B08B 7/0035* (2013.01); *B08B 7/0071* (2013.01); *G03F 7/70033* (2013.01); *G03F 7/70733* (2013.01); *G03F 7/70925* (2013.01); *H01L 21/67028* (2013.01); *H01L 21/67225* (2013.01)

(58) Field of Classification Search
CPC ............ G03F 7/70341; G03F 7/70733; G03F 7/0033; G03F 1/82; H01L 21/67028; H01L 21/67225; B08B 7/0035; B08B 7/0071
USPC .......................................... 355/30
See application file for complete search history.

(56) References Cited

U.S. PATENT DOCUMENTS

| | | | |
|---|---|---|---|
| 9,726,990 B2 | 8/2017 | Ko et al. | |
| 10,459,352 B2 * | 10/2019 | Chang | ............... G03F 7/70866 |
| 2011/0279799 A1 * | 11/2011 | Singer | ............... G03F 7/70925 |
| | | | 355/53 |

(Continued)

FOREIGN PATENT DOCUMENTS

| | | |
|---|---|---|
| CN | 102077142 A | 5/2011 |
| CN | 109581818 A | 4/2019 |

(Continued)

OTHER PUBLICATIONS

Office Action, Cited Reference and Search Report dated Aug. 10, 2021 issued by the Taiwan Intellectual Property Office for Taiwanese Counterpart Application No. 109131562.

*Primary Examiner* — Hung Nguyen
(74) *Attorney, Agent, or Firm* — WPAT, P.C., Intellectual Property Attorneys; Anthony King (57) ABSTRACT

A method for cleaning a reflective photomask is provided. The method includes: disposing the reflective photomask in a chamber; providing hydrogen radicals to the chamber; and exposing the reflective photomask to the hydrogen radicals. A method of manufacturing a semiconductor structure and system for forming a semiconductor structure are also provided.

20 Claims, 9 Drawing Sheets

(56) References Cited

U.S. PATENT DOCUMENTS

2017/0363975 A1\* 12/2017 Kochersperger .... G03F 7/70066
2020/0103769 A1\* 4/2020 Chen ......................... B08B 1/00
2020/0124994 A1 4/2020 Ko et al.
2021/0302827 A1\* 9/2021 Cullins ..................... G03F 1/62

FOREIGN PATENT DOCUMENTS

| EP | 1764653 A2 | 3/2007 |
|---|---|---|
| TW | 200811607 A | 3/2008 |
| TW | 201915617 A | 4/2019 |

\* cited by examiner

CLEANING METHOD, METHOD FOR FORMING SEMICONDUCTOR STRUCTURE AND SYSTEM THEREOF

PRIORITY CLAIM AND CROSS-REFERENCE

This application claims the benefit of prior-filed provisional application No. 62/907,963, filed on Sep. 30, 2019.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling-down process generally provides benefits by increasing production efficiency and lowering associated costs while increasing the amount of functionality that can be provided in the reduced chip area. Such scaling down results in increased complexities of processing and manufacturing ICs, and the processes required for effective quality control of the products have become increasingly stringent.

BRIEF DESCRIPTION OF THE DRAWINGS

Aspects of the embodiments of the present disclosure are best understood from the following detailed description when read with the accompanying figures. It should be noted that, in accordance with the standard practice in the industry, various structures are not drawn to scale. In fact, the dimensions of the various structures may be arbitrarily increased or reduced for clarity of discussion.

DETAILED DESCRIPTION

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

As a trend of small dimension, a photolithographic apparatus and photolithography operations using extreme UV (EUV) radiation source and specified photomask are introduced to the advanced generations of the electric devices. Cleaning is one of the most important aspects of photomask because even the smallest contaminant may transfer defects on wafers in a patterning operation, and such contaminant can cause proximity variation to integrated circuit manufactured by such lithography operation. To make sure the photomask meets the manufacture requirement, the mask is scheduledly sent back to the Ebeam Operation (EBO) site (the site for manufacturing the photomask) from the Fabrication (FAB) site (the site for fabricating semiconductors), it usually takes more than 5 days at the EBO site to complete the cleaning of the photomask and send the photomask back to the FAB site.

The EUV photomask is conventionally cleaned at EBO site using a wet cleaning operation that chemicals or water can cause mask decay and mask scrap. In addition, residues and particles from the process of de-attaching and re-attaching the pellicle of the photomask can be another source of contaminant or defects. Therefore, the present disclosure provides a method for cleaning a photomask to improve cleaning efficiency and reduce possibility of further damage and/or contamination to the photomask.

The method of the present disclosure includes performing a dry cleaning operation on a photomask, wherein the dry cleaning operation includes providing hydrogen radicals to a cleaning chamber to remove carbon-containing contaminant on the pellicle and the pattern of the photomask. The method can be integrated with a manufacturing process of a semiconductor, and thus the method can be performed at the FAB site. The method can be performed prior to or after any operation involving the photomask of the manufacturing process, and it takes proximal 0.2 day to complete the cleaning process at the FAB site.

Figure 1:
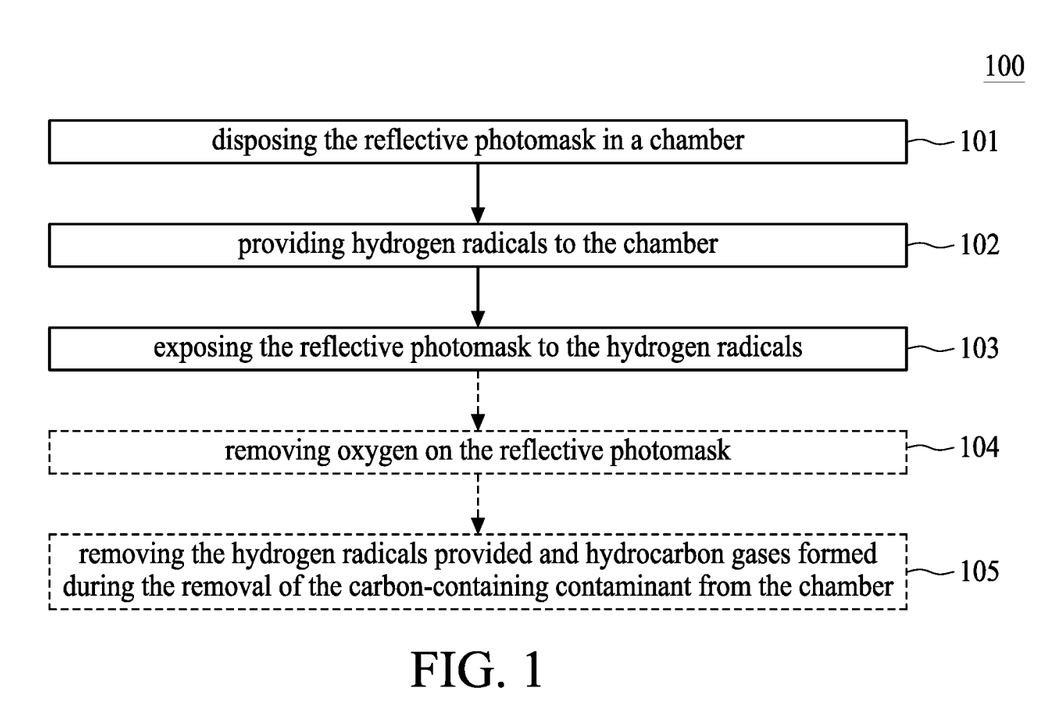
FIG. 1 is a flowchart showing various steps of a cleaning method applied on a reflective photomask in accordance with some embodiments of the present disclosure.

FIG. 1 is a flowchart of a cleaning method 100 for cleaning a photomask in accordance with some embodiments of the present disclosure. The cleaning method 100 includes: disposing the reflective photomask in a chamber (Operation 101); providing hydrogen radicals to the chamber (Operation 102); and exposing the reflective photomask to the hydrogen radicals (Operation 103). The cleaning method 100 may further include additional processes according to different implementation. In some embodiments, the cleaning method 100 may further include: removing oxygen on the reflective photomask (Operation 104). In some embodiments, the cleaning method 100 may further include: removing the hydrogen radicals provided and hydrocarbon gases formed during the removal of the carbon-containing contaminant from the chamber (Operation 105). In order to further illustrate details of the method 100 and the concept of the present disclosure, illustration accompanying with a diagram as shown in FIG. 2 is provided in accordance with some embodiments of the present disclosure.

Figure 2:
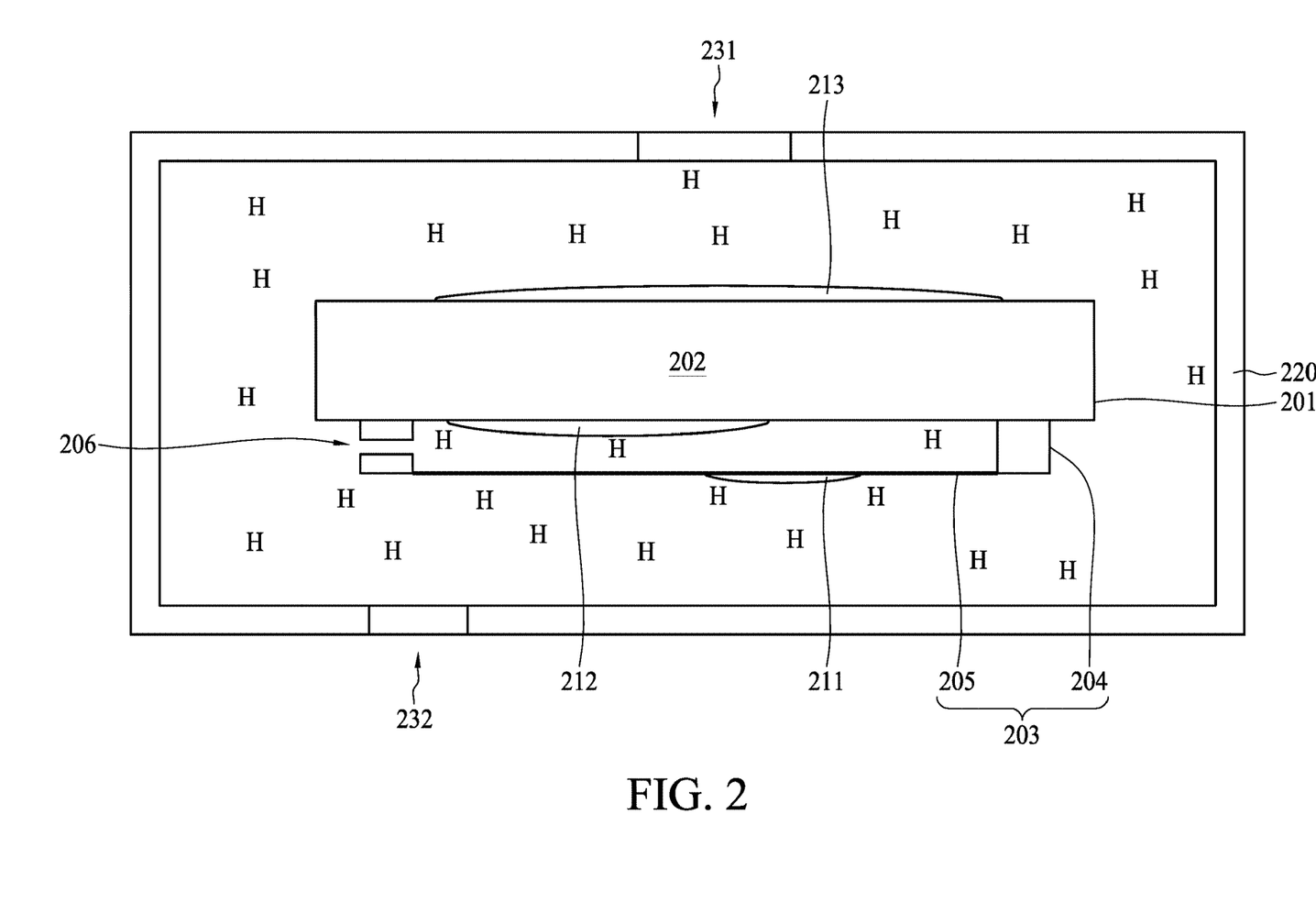
FIG. 2 is a diagram showing a dry cleaning operation performed on a photomask in a processing chamber in accordance with some embodiments of the present disclosure.

Referring to FIG. 2, a photomask 201 is provided. The photomask 201 includes a photomask substrate 202 and a pellicle 203. The pellicle 203 is composed of a frame structure 204 and a membrane 205. The pellicle 203 is to protect a pattern of the photomask substrate 202 from damage or particles from tools or environment. The membrane 205 covers the pattern of the photomask substrate 202, and the frame structure 204 connects the membrane 205 to the photomask substrate 202. In some embodiments, the photomask 201 is a reflective photomask and used in an extreme ultraviolet (EUV) lithography operation. The frame structure 204 includes a venting hole 206 to allow gases passing through. In some embodiments, the frame structure 204 is connected to the photomask substrate 202 by glue. In some embodiments, the photomask 201 includes only the photomask substrate 202 without the pellicle 203 attached to the photomask substrate 202 in the extreme ultraviolet (EUV) lithography operation.

The membrane 205 is to protect the pattern from particles from the environment. However, some contaminants form the environment and/or from a lithographic operation may contaminate a photomask 201 through the venting hole 206. As shown in 2 in accordance with some embodiments, contaminants may attach to the membrane 205 (e.g. the contaminants 211), the pattern of the photomask substrate 202 (e.g. the contaminants 212), and/or a backside of the photomask substrate 202 (e.g. the contaminants 213). The contaminants 211, 212 and/or 213 can result in defects on a semiconductor during the EUV lithography operation or an exposure operation of a photolithography process.

In order to remove the contaminants 211, 212 and/or 213, the photomask 201 is disposed in a chamber 220 as shown in FIG. 2 to perform the cleaning operation of the method 100. Hydrogen radicals are provided into the chamber 220 through a hole 231 on the chamber 220. In some embodiments, the hole 231 is for air or reagent injection into the chamber 220. Hydrogen radicals till the chamber 220 and enter the space between the membrane 205 and the photomask substrate 202 as shown in FIG. 2 indicated as capital H. In some embodiments, the hydrogen radicals enter the space between the membrane 205 and the photomask substrate 202 through the venting hole 206. Hydrogen radicals can convert carbon and oxygen based contaminants into volatile species. In some embodiments, the hydrogen radicals react with a carbon-containing contaminant to form hydrocarbon gases. In some embodiments, the carbon-containing contaminant includes at least one of carbon and hydrocarbon. The volatile species are then exhausted out through a hole 232 of the chamber 220. In some embodiments, the hydrocarbon gases formed during the removal of the carbon-containing contaminants are removed from the chamber 220 together with unreacted hydrogen radicals. The hydrogen radicals can be a deoxidizer that to remove oxygen on the photomask 201 to prevent oxidation of materials of the photomask 201. The oxygen is removed by a reduction reaction with the hydrogen radicals. De-oxidation of the materials of the photomask 201 by the hydrogen radicals can be another advantage of the dry cleaning operation of the method 100. Deterioration of the material of the photomask 201 and damages of the pattern of the photomask substrate 202 can be prevented. Therefore, lifetime of the photomask 201 and product yield can be improved.

The hydrogen radicals can be generated by various methods. In some embodiments, the hydrogen radicals are generated by a plasma bombardment. In some embodiments, the hydrogen radicals are generated by a heat decomposition. It is not limited herein.

The method 100 of the present disclosure is applied on a reflective photomask or a photomask utilized in an EUV lithography operation. The reflective photomask can withstand hydrogen radicals due to material properties of the reflective photomask, and thus the dry cleaning operation of the method 100 can efficiently remove carbon and oxygen based contaminants without damaging the reflective photomask. A conventional optical photomask cannot withstand hydrogen radicals due to different material properties and different requirements of the photolithography process, and the hydrogen radicals may not be applied to the optical photomask. For instance, an attenuated phase-shift mask (APSM) is applied in technology nodes N28 or above, and an EUV mask is applied in technology nodes N5 or below. Manufactures of different generations of semiconductors involves different exposure tools with different technical requirements and limitations. Conventional exposure tools and the APSM utilized in the technology nodes N28 or above are not designed to withstand hydrogen radicals. Materials of the pellicle 203 on the conventional optical photomask can be damaged by the hydrogen radicals. However, the present disclosure is not limited herein. With the progress of science and technology and the change of materials, the dry cleaning operation of the present invention may be applied to various types of photomasks in the future.

Figure 3:
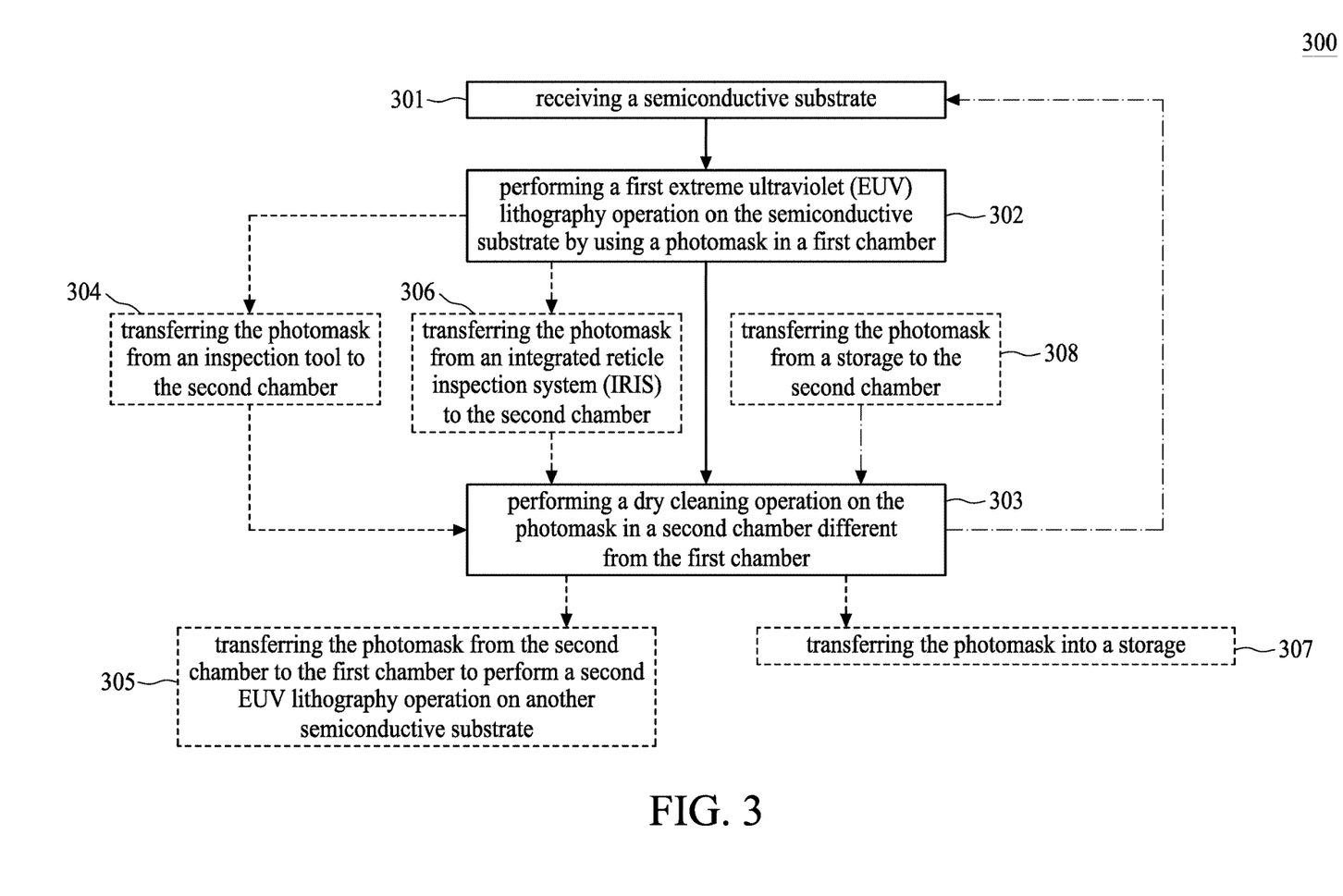
FIG. 3 is a flowchart showing various steps of a method for manufacturing a semiconductor structure in accordance with some embodiments of the present disclosure.

The method 100 can be integrated with a manufacturing method of a semiconductor at one or more stages of the manufacturing method. FIG. 3 is a flowchart of a method 300 for manufacturing a semiconductor structure involving an EUV lithography operation. The method 300 includes several operations as shown in FIG. 3. The method 300 includes: receiving a semiconductive substrate (Operation 301); performing a first extreme ultraviolet (EUV) lithography operation on the semiconductive substrate by using a photomask in a first chamber (Operation 302); and performing a dry cleaning operation on the photomask in a second chamber different from the first chamber (Operation 303).

The method 300 may further include additional operations according to different implementation. In some embodiments, the method 300 may further include: transferring the photomask from an inspection tool to the second chamber (Operation 304) prior to the operation 303. In some embodiments, the method 300 may further include: transferring the photomask from the second chamber to the first chamber to perform a second EUV lithography operation on another semi conductive substrate (Operation 305) after the operation 303. In some embodiments, the method 300 may further include: transferring the photomask from an integrated reticle inspection system (IRIS) to the second chamber (Operation 306) prior to the operation 303. In some embodiments, the method 300 may further include: transferring the photomask into a storage (Operation 307) after operation 303. In some embodiments, the method 300 may further include: transferring the photomask from a storage to the second chamber (Operation 308) prior to operation 303 and transferring the photomask from the second chamber to the first chamber to perform the first EUV lithography operation (i.e., performing operations 301 and 302 after operation 303).

A photomask (such as the photomask 201 shown in FIG. 2) is utilized in the EUV lithography operation performed on the semiconductive substrate. It should be noted that the operation 302 can be performed prior to or after the operation 303. In some embodiments, the operation 303 can be performed prior to and after the EUV lithography operation of the operation 302. The numerals of the operations are to distinguish different operations of the method 300, but it is not intended to limit the operations to a certain sequence.

Figure 4:
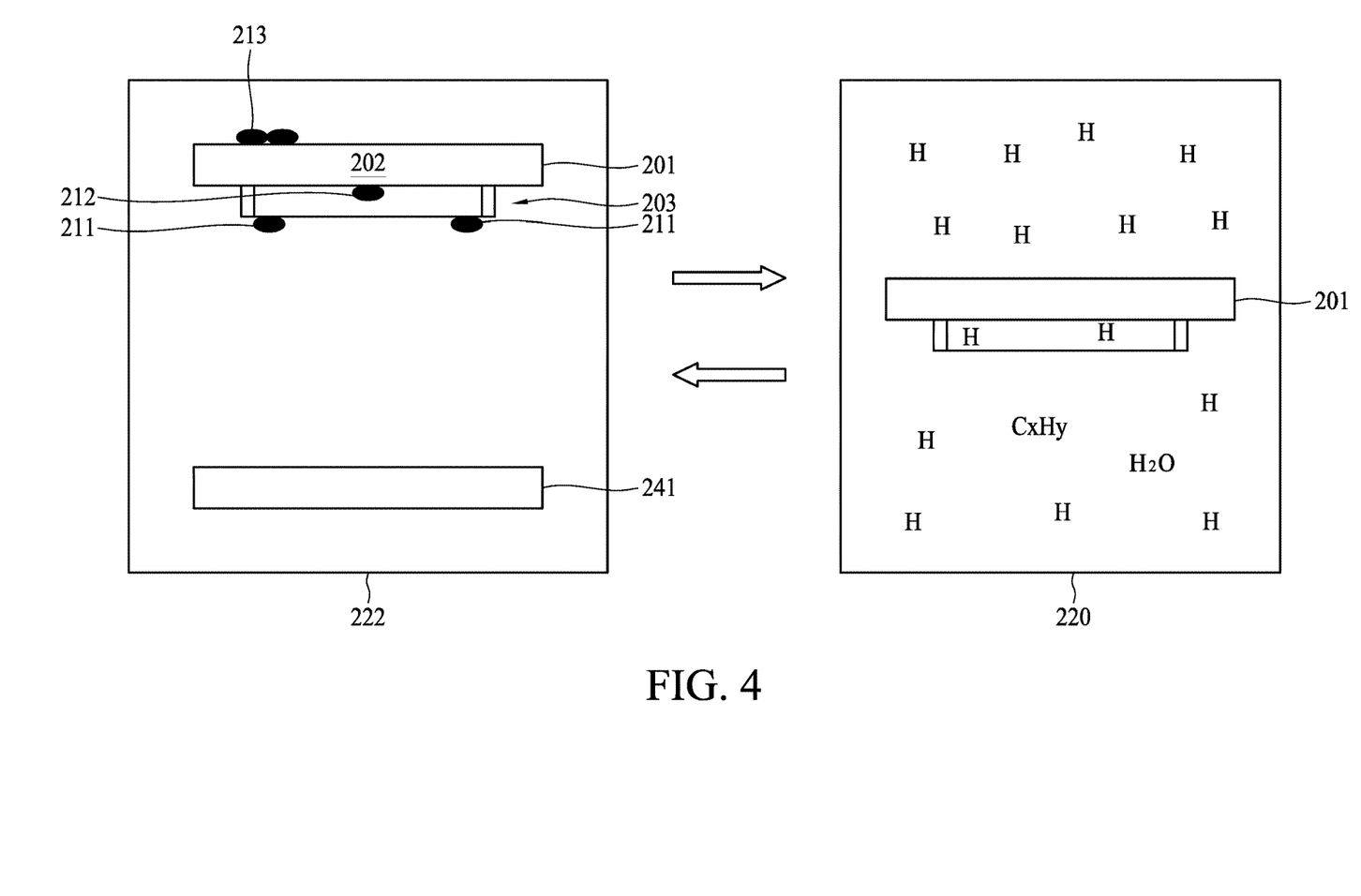
FIG. 4 is a diagram illustrating the method shown in FIG. 3 in accordance with some embodiments of the present disclosure.

FIG. 4 shows a diagram of the aforementioned method 300 shown in FIG. 3 in accordance of some embodiments of the present disclosure. The photomask 201 is utilized in the EUV lithography operation performed in a chamber 222. The pattern of the photomask 201 is transferred to a semiconductive substrate 241. Contaminants (e.g. the contaminants 211, 212 and 213) from the environment and/or the EUV lithography operation are attached to the photomask 201. The photomask 201 is transferred to the chamber 220 to perform the dry cleaning operation by providing the hydrogen radicals into the chamber 220. After reactions with the hydrogen radicals, volatile gases are generated from the contaminants 211, 212 and 213. In some embodiments, the contaminants 211, 212 and 213 from the EUV lithography operation mostly contain carbon, hydrocarbon, and/or oxygen. In some embodiments, the volatile gases include at least one of hydrocarbon (CxHy) and dihydrogen monoxide ($H_2O$). In some embodiments, the operation 303 is performed after the operation 302 to remove the contaminants 211, 212 and 213 from the EUV lithography operation. In some embodiments, when performing operation 305, the photomask 201 is transferred back to the chamber 222 to perform another EUV lithography operation on another semiconductive substrate 241 from the chamber 220 after the dry cleaning operation.

The pellicle 203 does not de-attached from the photomask substrate 202 during the dry cleaning operation as illustrated above, and the contaminants 211, 212 and/or 213 can be removed by the hydrogen radicals. In a conventional cleaning procedure, the photomask 201 has to be sent to the EBO site and then sent back to the AB site after the cleaning procedure. The conventional cleaning procedure is not just time consuming but also possible to damage the pattern of the photomask substrate 202 during the de-attaching and re-attaching process of the pellicle 203 from and to the photomask substrate 202. Therefore, the present disclosure provides a novel cleaning procedure which can be integrated with the manufacturing process of a semiconductor to save the time for cleaning the photomask 201 but also avoid damage to the pattern of the photomask substrate 201 from the de-attaching and/or re-attaching process.

In some embodiments, the contaminants 211, 212 and 213 are from the environment at storage or during transportation, and the operation 303 is performed prior to the operation 302 to remove the contaminants 211, 212 and 213. For example, the operation 308 may be performed prior to the operation 303. Further, the operations 301 and 302 are performed after the operation 303. Thus, defects on the semiconductive substrate 241 due to the contaminated photomask 201 during the storage can be prevented.

In some embodiments the contaminants 211, 212 and 213 being from the environment at the storage, the operation 303 can be performed after the photomask 201 is transferred from the storage and prior to the operation 302. In some embodiments in order to limit contamination at the storage, the operation 303 can be performed prior to the photomask 201 is sent to the storage after the EUV lithography operation, such as the operation 307. In some embodiments, the dry cleaning operation is performed after each of transportations of the photomask 201 between machine stations to prevent the contaminants 211, 212 and 213 moving along with the photomask 201 to enter a next machine station.

In some embodiments, the method 300 further includes an inspection operation, such as the operations 304 and 306. The inspection operation can be performed prior to and/or after the EUV lithography operation, transportation of the photomask 201, and/or storage of the photomask 201. The inspection operation is performed to detect damage, defects and/or particles on the photomask 201. Thus, a use of a damaged and/or photomask 201 having particles attached thereon can be prevented. It should be noted that the particles and the contaminants referred in the specification are different in their sizes and sources. The particles are mostly from the EUV operation or an optical photography operation. In some embodiments, the particles are materials of (or small or tiny pieces) of the photomask substrate 202 and/or of the semiconductive substrate 241, which may be damaged during the EUV operation or the optical photography operation. The contaminants on the other hand are mostly from the environment. The contaminants can be elements or compounds in the environment of the storage, the EUV or photography chamber and/or the transportation. The particles usually have a greater size than the contaminants. In some embodiments, the contaminants have a dimension less than or equal to 50 nanometers (nm), which is generally not detectable by a photomask inspector. In some embodiments, and the particles have a dimension greater than 100 nm. In some embodiments, the particles may be attached to portions of the pattern of the photomask substrate 202 and result in defects on some portions of the patterned semiconductive substrate 202. In some embodiments, the contaminants may result in a formation of a thin film (generally the thin film contains carbon) on the photomask substrate 202, and lead to an enlarged or altered CD (critical dimensions) of patterns formed on the semiconductive substrate 202.

However, in order to provide a better cleaning result of the photomask 201, the dry cleaning operation can be performed prior to or after the inspection operation. In some embodiments, the dry cleaning operation is performed to prevent defects on the semiconductive substrate 241 due to the contaminated photomask 201.

Figure 5:
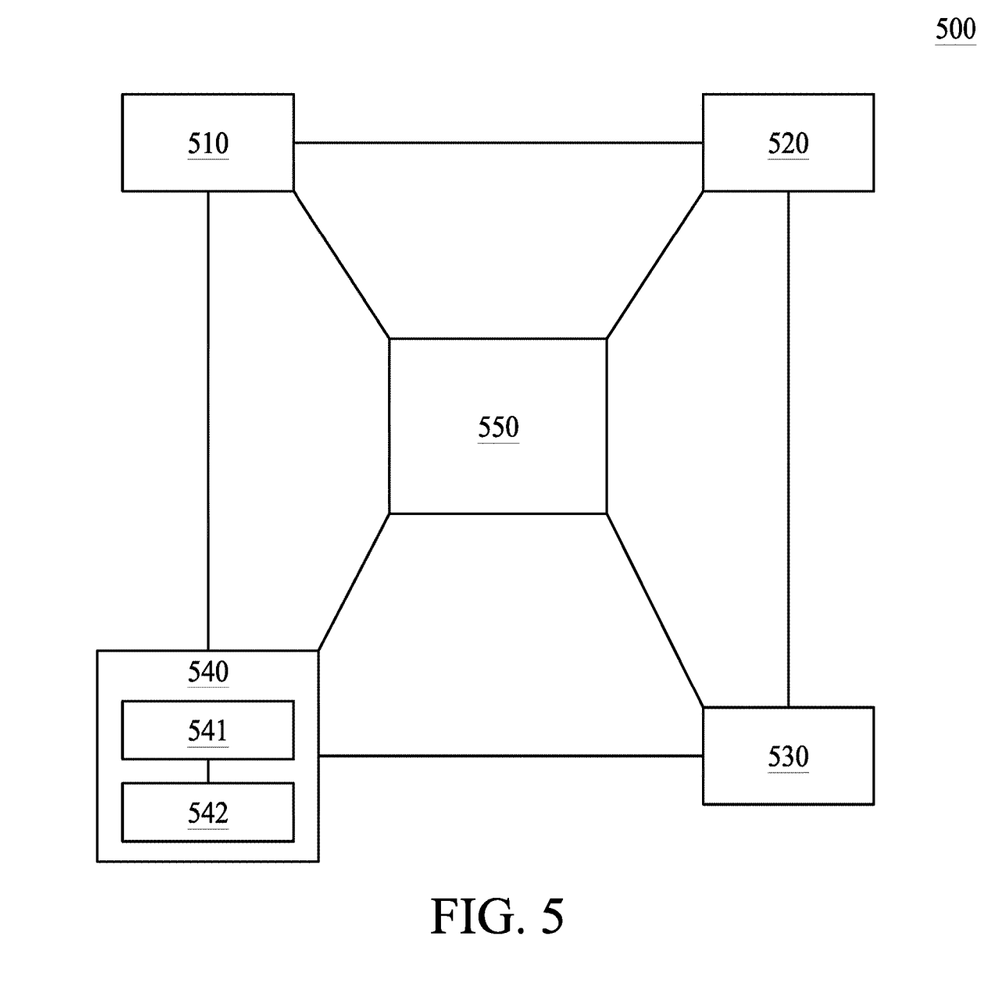
FIGS. 5-6 are diagrams of systems in accordance with different embodiments of the present disclosure forming a semiconductor structure.

FIG. 5 shows a diagram of a system 500 in accordance with some embodiments of the present disclosure forming a semiconductor structure. The system 500 is allowed to perform the method 100 and the method 300 at the FAB site.

The system 500 includes a storing tool 510, an inspection tool 520, an exposure tool 530, and a cleaning tool 540. It should be noted that the system 500 can include other tools or machine stations for processing the semiconductive substrate 241 or forming the semiconductor structure, as previously discussed in FIG. 2. FIG. 5 shows only some of the tools of the system 500 to illustrate the concept of the present disclosure, but is not intended to limit the present disclosure. The storing tool 510 is for storage of the photomask 201. The inspection tool 520 is for inspecting the photomask 201 and/or performing other quality-checking operations before and/or after the photomask 201 is applied in the EUV lithography operation. The exposure tool 530 is to perform an exposure operation to transfer the pattern of the photomask 201 to the semiconductive substrate 241. In some embodiments, the exposure operation can be an operation of the EUV lithography operation.

In some embodiments, the system 500 further includes a carrier 550, configured to transfer the photomask 201 between the storing tool 510, the inspection tool 520, the exposure tool 530, and the cleaning tool 540. In some embodiments, the carrier 550 can be a robot or a machine arm. In some embodiments as shown in FIG. 5 of the system 500, the cleaning tool 540 is independent to the storing tool 510, the inspection tool 520 and the exposure tool 530. The photomask 201 is transferred by the carrier 550 to and from the cleaning tool 540. In other embodiments, the cleaning tool 540 can be integrated with one or more of the storing tool 510, the inspection tool 520 and the exposure tool 530.

Figure 6:
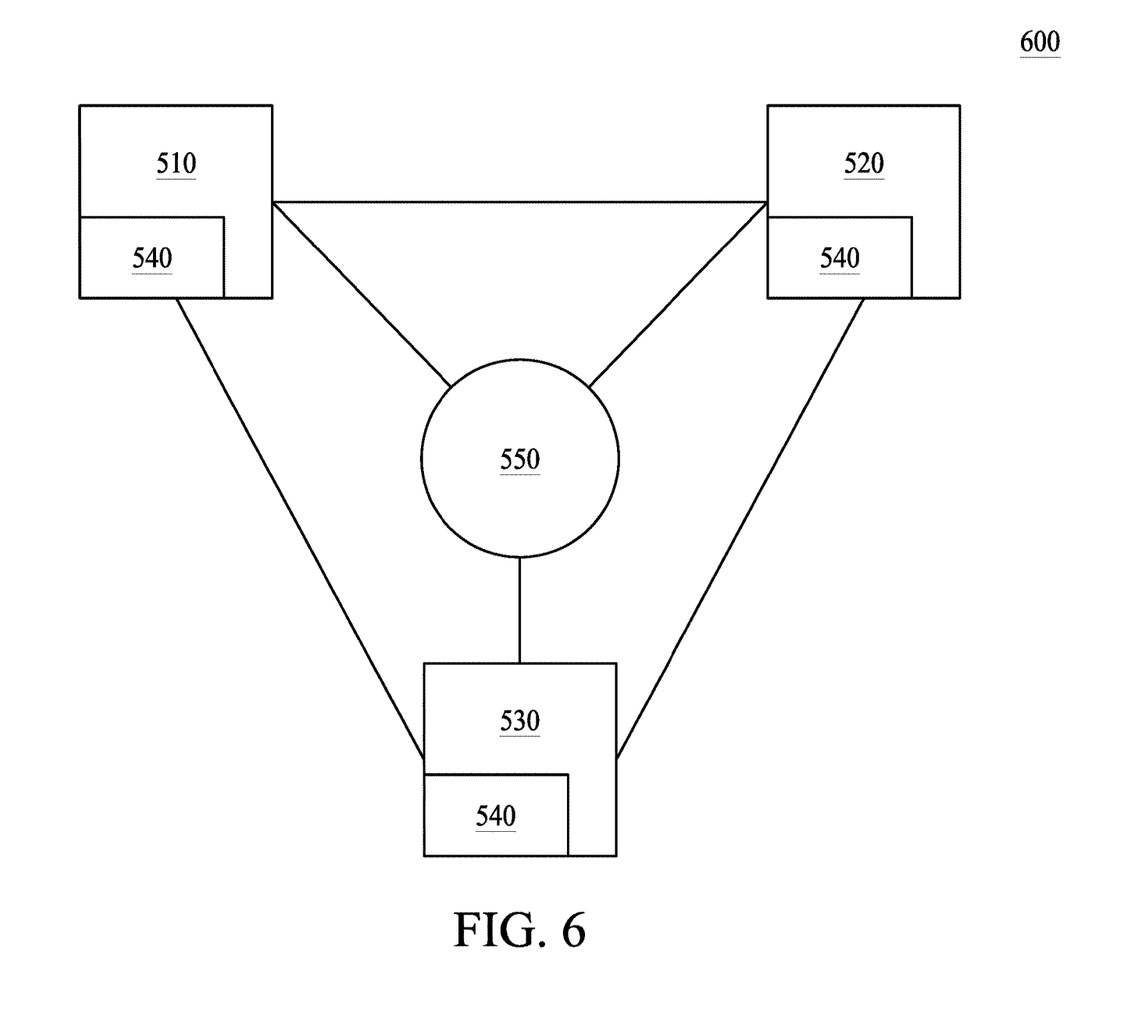

FIG. 6 illustrates a system 600 being similar to the system 500 but the cleaning tool 540 is integrated with one or more of the storing tool 510, the inspection tool 520 and the exposure tool 530 in the system 600. The carrier 550 is to transfer the photomask 201 between the storing tool 510, the inspection tool 520 and the exposure tool 530.

The cleaning tool 540 is to perform the dry cleaning operation of the operation 303 on the photomask 201 to remove carbon-containing contaminants attached on the photomask 201. The cleaning tool 540 in the system 500 or the system 600 can include a processing chamber 541 (similar to the chamber 220) and a hydrogen radical producer 542. The photomask 201 is disposed in the processing chamber 541 during the dry cleaning operation, and the hydrogen radical producer 542 is configured to produce the hydrogen radicals into the processing chamber 541.

In order to further illustrate concepts and applications of the present disclosure, illustration of the method 300 applied in the system 600 in accordance with some embodiments of the present disclosure is provided in the specification.

Figure 7:
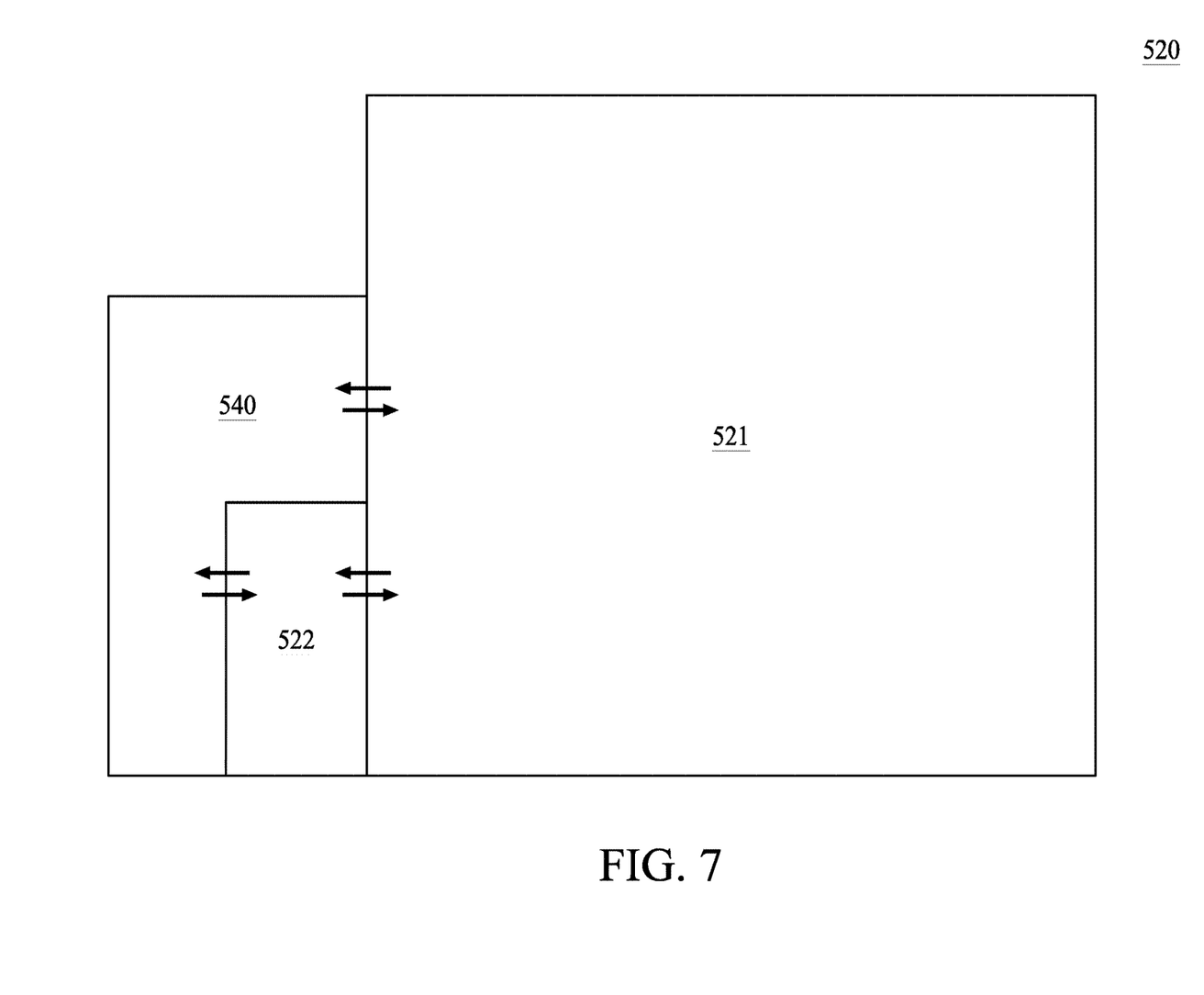
FIGS. 7-9 are diagrams of different tools of a system in accordance with different embodiments of the present disclosure forming a semiconductor structure.

In some embodiments as shown in FIG. 6 and FIG. 7, the cleaning tool 540 is integrated with the inspection tool 520. Referring to FIG. 7 showing the inspection tool 520 in accordance with some embodiments of the present disclosure, the inspection tool 520 includes an inspection module 521 and a load port 522. In some embodiments, the photomask 201 can be transferred between the load port 522 and the cleaning tool 540. In some embodiments, the photomask 201 can be transferred between the inspection module 521 and the cleaning tool 540. In some embodiments, the photomask 201 can be transferred to the cleaning tool 540 from or to the inspection module 521 through the load port 522.

In some embodiments, a mask inspection is performed on the photomask 201 in the inspection module 521 prior to the dry cleaning operation. The photomask 201 is transferred to the inspection tool 520 to perform the mask inspection on the photomask 201. The method 300 can further include: determining a result of the mask inspection; and the dry cleaning operation is performed if the result shows the photomask 201 fails the mask inspection. If the photomask 201 fails the mask inspection, the photomask 201 is suspected also contaminated, and the contaminants 211, 212 and 213 are suspected resulting possible defects on the semiconductive substrate 241, the dry cleaning operation is performed after the mask inspection. The photomask 201 is transferred from the inspection tool 520 to the cleaning tool 540 to perform the dry cleaning operation on the photomask 201.

In some embodiments, the mask inspection is performed on the photomask 201 after the dry cleaning operation. The photomask 201 is transferred to the cleaning tool 540 prior to transferring to the inspection tool 520. The dry cleaning operation performed prior to the mask inspection can remove contaminants 211, 212 and/or 213, and the mask inspection may provide a more accurate result of particle detection on the photomask 201. The photomask 201 can be transferred back to the cleaning tool 540 to perform another dry cleaning operation if the photomask 201 fails the mask inspection. In some embodiments, the photomask 201 is transferred to the exposure tool 530, the storing tool 510 or another tool of the system 600 if the photomask 201 passes the mask inspection.

Figure 8:
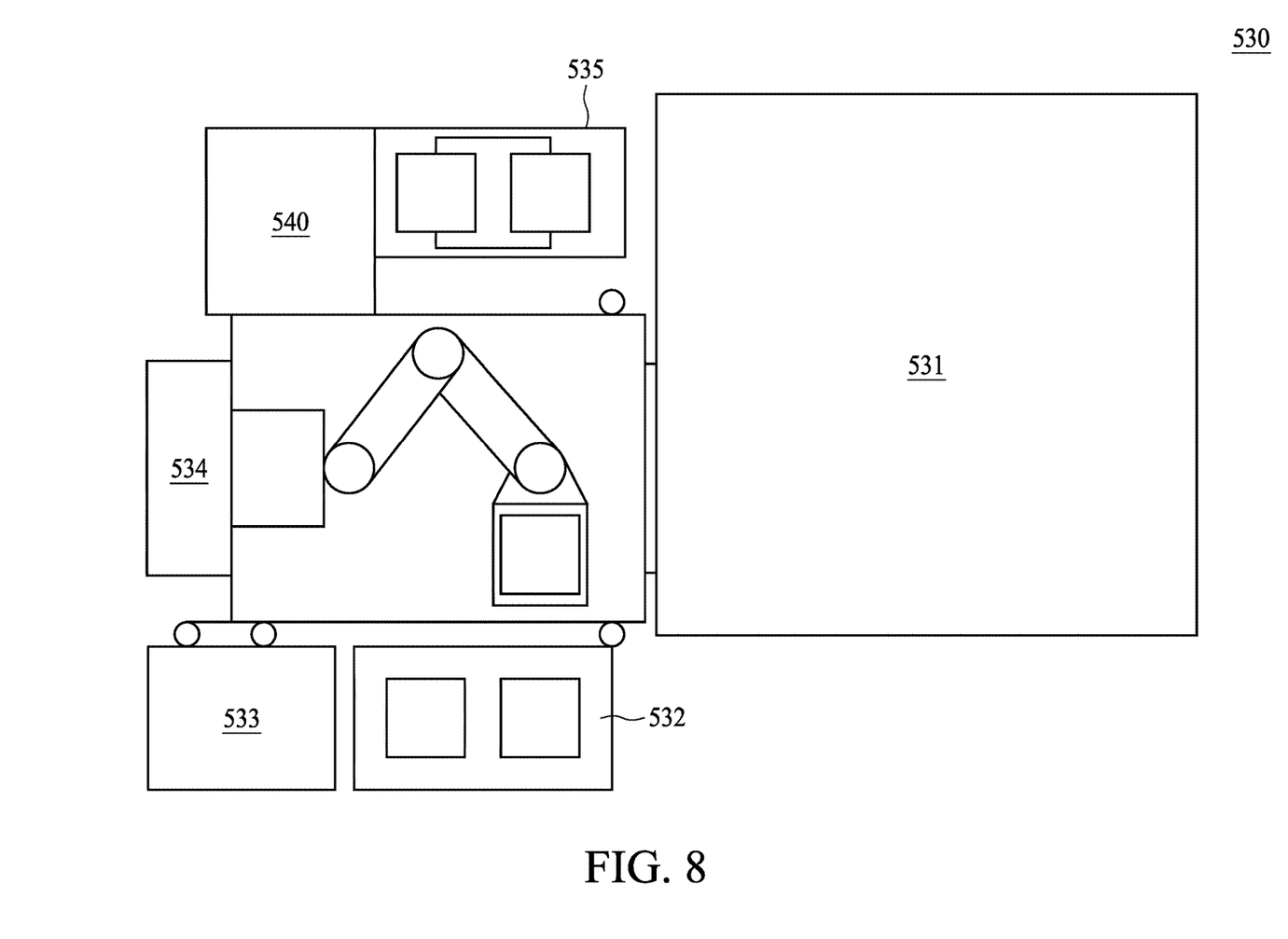

In some embodiments as shown in FIGS. 6 and 8, the cleaning tool 540 is integrated with the exposure tool 530. Referring to FIG. 8 showing the cleaning tool 540 integrated with the exposure tool 530 in accordance with some embodiments of the present disclosure. The exposure tool 530 includes several units. In the embodiments as shown in FIG. 8, the exposure tool 530 includes an exposure unit 531, a load port 532, an operator interface 533, a robot 534, and an integrated reticle inspection system (IRIS) 535. The exposure unit 531 is configured to perform the exposure operation on the semiconductive substrate 241 utilizing the photomask 201. In some embodiments, the exposure unit 531 includes an EUV light source. In some embodiments, the exposure unit 531 includes a processing chamber similar to the chamber 222 as illustrated in 4 and previous paragraphs. The photomask 201 is loaded to or unloaded from the exposure tool 530 through the load port 532. The robot 534 is configured to transfer the photomask 201 between the IRIS 535, the load port 532, the exposure unit 531 and the cleaning tool 540. The operator interface 533 allows an operator to control and monitor transportation and condition of the photomask 201 and the semiconductive substrate 241.

In some embodiments, the dry cleaning operation can be performed prior to or after the exposure operation in the exposure unit 531. The dry cleaning operation performed prior to the exposure operation can reduce possibility of defects formed on the semiconductive substrate 241 due to the contaminants on the photomask 201. The dry cleaning operation performed after the exposure operation can remove contaminants attached on the photomask 201 during the exposure operation before the photomask 201 is used in another exposure operation or before the photomask 201 is transferred to the storing tool 510.

The IRIS 535 is configured to scan the pellicle 203 and the backside of the photomask substrate 202. In some embodiments, the photomask 201 is transferred to the IRIS 535 prior to the exposure operation performed in the exposure tool 530. The method 300 can further include: transferring the photomask 201 from the IRIS 535 to the processing chamber of the exposure unit 531. In some embodiments, similar to the mask inspection, the dry cleaning operation is performed after a scanning operation performed in the IRIS 535. In some embodiments, the dry cleaning operation is performed after the scanning of the IRIS 535 and prior to the exposure operation.

In some embodiments, the dry cleaning operation is performed prior to the scanning operation performed in the IRIS 535 and prior to the exposure operation. The photomask 201 is transferred to the cleaning tool 540 prior to transferring the photomask 201 to the IRIS 535. In some embodiments, the dry cleaning operation is set as a routine operation regardless the result of the scanning operation performed in the IRIS 535. A result of the scanning operation performed in the IRIS 535 is determined prior to the exposure operation. In some embodiments, if the result shows the photomask 201 is clean, the photomask 201 is then transferred to the exposure unit 531 for performing the exposure operation. If the result shows the photomask 201 is not clean, the photomask 201 may be sent to clean, and the dry cleaning operation is optionally performed again prior to the scanning operation performed in the IRIS 535. In some embodiments, the dry cleaning operation can be repeatedly performed until the photomask 201 passes the IRIS 535.

In some embodiments, the scanning operation and the dry cleaning operation are performed after the exposure operation. The EUV light source can result in decaying of materials of the photomask, and the exposure operation in the exposure unit 531 may be a source of the contaminants. The method 300 can further include: transferring the photomask from the processing chamber of the exposure unit 531 to the IRIS 535. The dry cleaning operation can be performed prior to or after the scanning operation. In some embodiments, the dry cleaning operation is performed after the scanning operation performed in the IRIS 535 and after the exposure operation. In some embodiments, the dry cleaning operation is performed prior to the scanning operation performed in the IRIS 535 and after the exposure operation. The dry cleaning operation is performed to remove the contaminants from the environment during the exposure operation prior to or after the scanning operation performed in the IRIS 535. The dry cleaning operation can be repeatedly performed depending on different applications.

In the embodiments as shown in FIG. 8, the cleaning tool 540 is disposed adjacent to the IRIS 535 (or outside the IRIS 535). In some embodiments, the cleaning tool 540 is inside the IRIS 535. However, the present disclosure is not limited herein as long as the above illustrated process can be performed or the above illustrated benefits can be achieved. In other embodiments, the cleaning tool 540 can be integrated with one or more of the exposure unit 531, the load port 532, and the robot 534. In addition, the cleaning tool 540 can be integrated inside or outside of one or more of the exposure unit 531, the load port 532, and the robot 534, and it is not limited herein.

Figure 9:
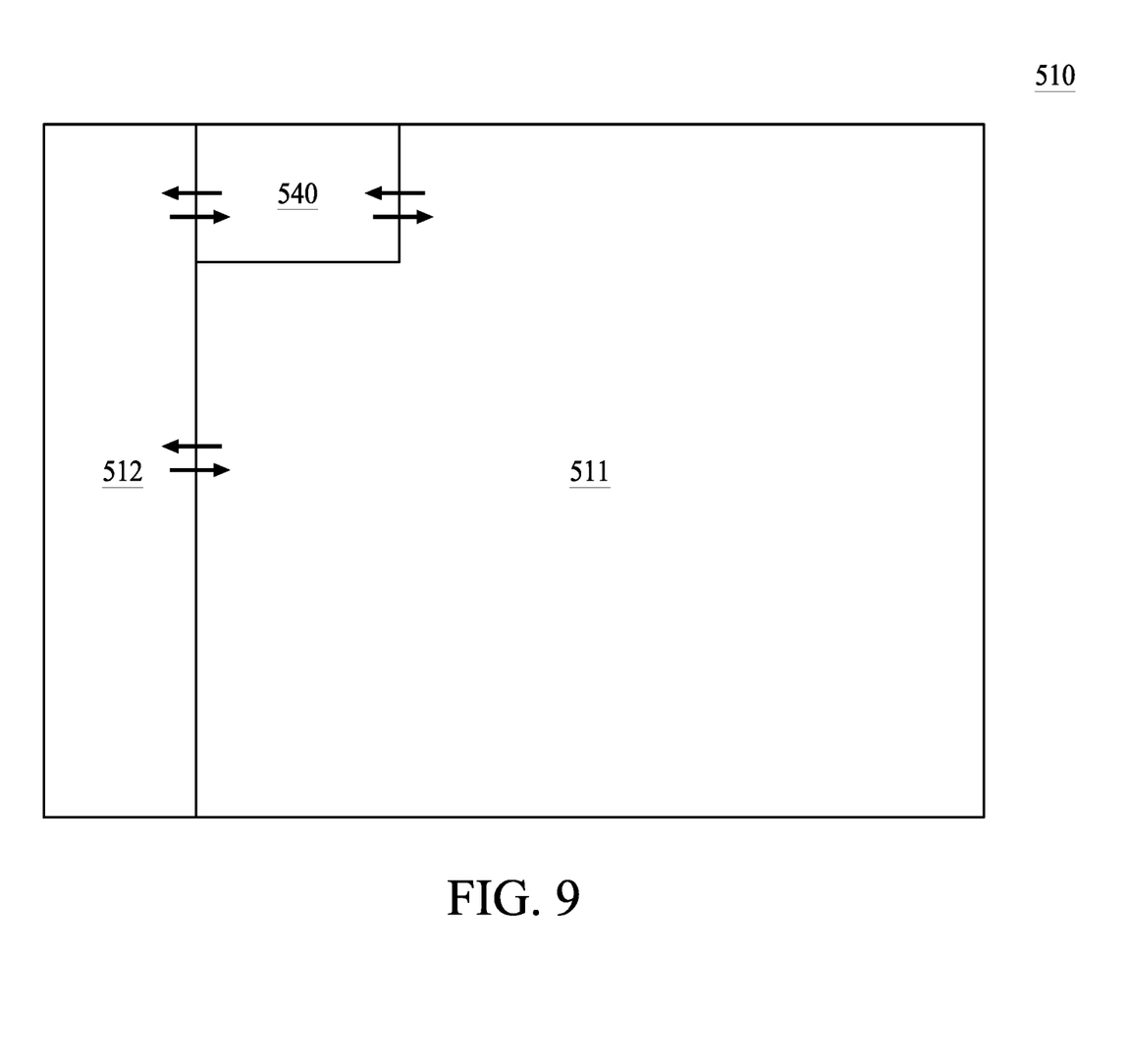

In some embodiments as shown in FIGS. 6 and 9, the cleaning tool 540 is integrated with the storing tool 510. Referring to FIG. 9 shown the storing tool 510 in accordance with some embodiments of the present disclosure, the storing tool 510 includes a stocker 511 and a load port 512. The stocker 511 includes a space for photomask storage, and the load port 512 is to load or unload the photomask 201 into or out from the stocker 511. In some embodiment, the photomask 201 can be transferred between the cleaning tool 540 and the load port 512. In some embodiments, the photomask 201 can be transferred between the cleaning tool 540 and the stocker 511. In some embodiments, the photomask 201 can be transferred between the cleaning tool 540 and the stocker 511 through the load port 512.

The photomask 201 is transferred to the stocker 511 of the storing tool 510 for storage while the photomask 201 is not in used. The photomask 201 can be transferred to the storing tool 510 from the inspection tool 520, the exposure tool 530, or the cleaning tool 540. In some embodiments, the photomask 201 is transferred from the chamber 222 to the storing tool 510 after the EUV lithography operation. In some embodiments, the photomask 201 is transferred from the inspection module 521 to the storing tool 510 after the mask inspection. In some embodiments, the photomask 201 is transferred from the exposure unit 531 of the exposure tool 530 to the storing tool 510 after the exposure operation. In some embodiments, the cleaning tool 540 is integrated with (or inside) the stocker 511 as shown in FIG. 9, but the present disclosure is not limited herein.

In some embodiments, the photomask 201 is transferred to the stocker 511 after the dry cleaning operation. The photomask 201 can be stored at a clean condition. However, in some embodiments, the contaminants 211, 212 and/or 213 may be from the environment of the stocker 511, and the dry cleaning operation is performed after the photomask 201 is transferred from the stocker 511. The photomask 201 may be transferred out from the stocker 511 for the EMI lithography operation, the mask inspection, and/or the exposure operation. In some embodiments, the dry cleaning operation can be a routine operation, and the photomask 201 is transferred from the stocker 511 to the cleaning tool 540 per default time period. The photomask 201 is transferred from the stocker 511 to the processing chamber 541 of the cleaning tool 540 to remove contaminants attached on the photomask 201 at the storage. Thus, the photomask 201 is cleaned while it is used in the manufacturing process of the semiconductor structure.

The dry cleaning operation of the present disclosure uses hydrogen radicals to remove carbon and oxygen based contaminants from the environment, at storage, during transportation, and/or from the EUV lithography operation. The dry cleaning operation can be performed in-situ at the FAB site. Time for the in-situ dry cleaning operation can be reduced to 0.2 days compared to the conventional wet clean at EBO site, which takes about 5 days to send the photomask back to the FAB site. In addition, the dry cleaning operation can prevent damage and defects resulted from the wet cleaning and/or the de-attaching and re-attaching operation in the conventional wet cleaning process.

Some embodiments of the present disclosure provide a method for cleaning a reflective photomask. The method includes: disposing the reflective photomask in a chamber; providing hydrogen radicals to the chamber; and exposing the reflective photomask to the hydrogen radicals.

Some embodiments of the present disclosure provide a method of manufacturing a semiconductor structure. The method includes receiving a semiconductive substrate; performing a first extreme ultraviolet (EUV) lithography operation on the semiconductive substrate by using a photomask in a first chamber; and performing a dry cleaning operation on the photomask in a second chamber different from the first chamber.

Some embodiments of the present disclosure provide a system for forming a semiconductor structure. The system includes: a storing tool, configured to store a reflective photomask; an inspection tool, configured to inspect the reflective photomask; an exposure tool, configured to perform an exposure operation to transfer a pattern of the reflective photomask to a semiconductive substrate; and a cleaning tool, configured to perform a dry cleaning operation on the reflective photomask to remove carbon-containing contaminant attached on the reflective photomask. The cleaning tool includes: a processing chamber; and a hydrogen radical producer, configured to produce hydrogen radicals into the processing chamber.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor structure, comprising:
receiving a semiconductive substrate;
performing a first extreme ultraviolet (EUV) lithography operation on the semiconductive substrate by using a photomask in a first chamber, wherein contaminants are attached on the photomask; and
performing a dry cleaning operation on the photomask in a second chamber different from the first chamber, wherein the dry cleaning operation comprises:
providing hydrogen radicals to the second chamber; and
generating hydrocarbon gases by having the hydrogen radicals reacting with the contaminants, thereby removing at least a portion of the contaminants from the photomask.

2. The method of claim 1, further comprising:
transferring the photomask from an inspection tool to the second chamber prior to performing the dry cleaning operation.

3. The method of claim 1, further comprising:
transferring the photomask from the second chamber to the first chamber to perform a second EUV lithography operation on another semiconductive substrate after the dry cleaning operation.

4. The method of claim 1, further comprising:
transferring the photomask from an integrated reticle inspection system (IRIS) to the second chamber prior to performing the dry cleaning operation.

5. The method of claim 4, further comprising:
transferring the photomask from the IRIS to the first chamber to perform the first EUV lithography; and
transferring the photomask from the first chamber to the IRIS prior to transferring the photomask from the IRIS to the second chamber to perform the dry cleaning operation.

6. The method of claim 1, further comprising:
after the dry cleaning operation, transferring the photomask into a storage.

7. The method of claim 6, wherein the transferring the photomask into the storage comprises:
transferring the photomask to a mask stocker;
transferring the photomask from the mask stocker to the second chamber to perform the dry cleaning operation; and
transferring the photomask from the second chamber to the mask stocker after the dry cleaning operation.

8. The method of claim 1, further comprising:
transferring the photomask from a storage to the second chamber prior to performing the dry cleaning operation; and
transferring the photomask from the second chamber to the first chamber to perform the first EUV lithography operation.

9. A method of manufacturing a semiconductor structure, comprising:
receiving a semiconductive substrate;
performing a first extreme ultraviolet (EUV) lithography operation on the semiconductive substrate by using a photomask in a first chamber, wherein carbon-containing contaminants are attached on the photomask; and
performing a dry cleaning operation on the photomask in a second chamber different from the first chamber, wherein the dry cleaning operation comprises:
providing hydrogen radicals to the second chamber; and
generating hydrocarbon gases by having the hydrogen radicals reacting with the carbon-containing contaminants, thereby removing at least a portion of the carbon-containing contaminants from the photomask.

10. The method of claim 9, wherein the hydrogen radicals enter a space between a substrate of the photomask and a pellicle of the photomask, wherein the pellicle is attached to the substrate.

11. The method of claim 9, wherein the hydrogen radicals are generated by a plasma bombardment or a heat decomposition.

12. The method of claim 9, further comprising removing oxygen on the photomask.

13. The method of claim 12, wherein the oxygen is removed by a reduction reaction with the hydrogen radicals.

14. The method of claim 9, wherein the carbon-containing contaminant includes at least one of carbon and hydrocarbon.

15. The method of claim 9, further comprising removing the hydrogen radicals and hydrocarbon gases from the chamber.

16. A method of manufacturing a semiconductor structure, comprising:

receiving a semiconductive substrate;

performing a first extreme ultraviolet (EUV) lithography operation on the semiconductive substrate by using a photomask in a first chamber, wherein contaminants are attached on the photomask; and performing a dry cleaning operation on the photomask in a second chamber different from the first chamber, wherein the dry cleaning operation comprises:

providing hydrogen radicals to the second chamber, wherein the hydrogen radicals enter a space between a substrate of the photomask and a pellicle of the photomask, wherein the pellicle is attached to the substrate;

generating hydrocarbon gases by having the hydrogen radicals reacting with the contaminants, thereby removing at least a portion of the contaminants from the photomask; and exhausting the hydrocarbon gases from the second chamber.

17. The method of claim 16, further comprising removing oxygen on the photomask.

18. The method of claim 1, wherein the hydrogen radicals enter a space between a substrate of the photomask and a pellicle of the photomask, wherein the pellicle is attached to the substrate.

19. The method of claim 1, further comprising removing oxygen on the photomask.

20. The method of claim 1, wherein the photomask comprises a venting hole, and the hydrogen radicals is provided through the venting hole.

\* \* \* \* \*